United States Patent [19]

Welling et al.

[11] 4,377,198
[45] Mar. 22, 1983

[54] PASSIVE, RECYCLABLE COOLING SYSTEM FOR MISSILE ELECTRONICS

[75] Inventors: John R. Welling, Scottsdale, Ariz.; Donald L. Mattox, Huntsville, Ala.

[73] Assignee: Motorola Inc., Schaumburg, Ill.

[21] Appl. No.: 196,903

[22] Filed: Oct. 14, 1980

[51] Int. Cl.³ .............................................. F28F 13/00
[52] U.S. Cl. ........................................ 165/32; 165/41; 165/104.11; 165/104.33
[58] Field of Search .............. 165/32, 41, 104.17, 165/104.21, 104.33; 244/117 A

[56] References Cited

U.S. PATENT DOCUMENTS

| | | | |
|---|---|---|---|
| 2,499,736 | 3/1950 | Kleen | 62/333 X |
| 3,613,774 | 10/1971 | Bliss, Jr. | 165/32 |
| 3,651,865 | 3/1972 | Feldmanis | 165/80 C |
| 3,735,806 | 5/1973 | Kirkpatrick | 165/32 |
| 4,000,776 | 1/1977 | Kroebig et al. | 165/32 |
| 4,057,101 | 11/1977 | Ruka et al. | 165/DIG. 4 X |
| 4,057,104 | 11/1977 | Altoz | 165/104.21 |

Primary Examiner—Albert W. Davis, Jr.
Attorney, Agent, or Firm—Jonathan P. Meyer; Eugene A. Parsons

[57] ABSTRACT

A cooling system is described which is appropriate to many high performance missiles. The invention comprises heat pipe/thermal diode devices, and a heat storage medium. Heat generated by electronic components of a missile is either conducted to the skin of the missile to be dissipated or is stored internally for later dissipation.

8 Claims, 4 Drawing Figures

PASSIVE, RECYCLABLE COOLING SYSTEM FOR MISSILE ELECTRONICS

FIELD OF THE INVENTION

This invention relates to a cooling system for electronic components. Specifically, the system involves a new combination of heat removal devices designed to meet the heat dissipation, size, weight, and reliability requirements for cooling the avionics of various high performance, air-launched missiles. The characteristics of the system may recommend its use in other similar circumstances

BACKGROUND OF THE INVENTION

As is well known, virtually all electronic components produce some heat energy while operating and are more or less sensitive to extremes of temperature. Therefore, it becomes necessary to the proper operation of any electrical system that heat must be removed from the components before the temperature rises above some critical value. This problem may be particularly difficult to solve when the electronics are part of the avionics of an air-launched missile. The radar components and the associated power supply are particularly copious heat sources, the skin of the missile is subject to extreme temperature variations due to aerodynamic heating and cooling, and the limitations on the size, weight, power consumption, and reliability of the cooling system are severe.

Many missile cooling systems use an expendable liquid which absorbs heat from the electronics by undergoing a phase change from a liquid to a vapor which is vented from the missile. Such systems require large amounts of volume to store the coolant and thus generally require interconnection with a reservoir on the carry aircraft. These interconnections are subject to failure and require large amounts of maintenance. Further, such a system must be re-filled after each test or mission during which the missile is not fired.

Other generalized electronics cooling systems use heat pipes to transfer heat energy to a heat sink. The only large capacity heat sink available to a missile is the surrounding air and even that is unavailable when the temperature of the missile skin is heated above the critical temperature of the electronics. Small capacity heat sinks may be provided internal to the missile, such as heat of fusion storage devices which are well known, but the mass of the material used to store the heat energy limits the amount of heat which can be stored and thus the length of operation of the avionics. U.S. Pat. No. 3,651,865 teaches a cooling system employing heat pipes and a heat of fusion material, but in a system unsuitable for use in a high-performance missile. A missile cooling system is disclosed in copending application Ser. No. 947,672, but this system places severe limits on operation time of the electronics.

SUMMARY OF THE INVENTION

Accordingly, it is an object of this invention to provide a new and improved cooling system for the electronics of a missile.

It is a further object of the invention to provide a passive, self-contained cooling system for missile electronics which minimizes weight, eliminates external coolant supply requirements, and maximizes the allowable period of operation.

A particular embodiment of the invention provides a plurality of heat pipe/thermal diode devices which transfer heat efficiently from the electronics of a missile to the skin and which effectively prohibit heat transfer in the opposite direction, and a heat storage medium of the heat of fusion type in thermal communication with the electronics and the heat pipe/thermal diode devices.

Also disclosed is a method of cooling electronic components contained in a missile comprising the steps of establishing an efficient, low thermal mass heat path from the electronics to the skin of the missile, severing the heat path when the skin temperature exceeds a predetermined level, providing a heat storage medium in thermal contact with the electronics to remove heat energy therefrom, re-establishing the thermal path when the skin temperature falls below a predetermined level, and removing stored heat energy from the heat storage medium to recycle the system.

These and other objects will be obvious to one skilled in the art from the detailed description below and the drawings.

DETAILED DESCRIPTION OF THE INVENTION

Figure 1:
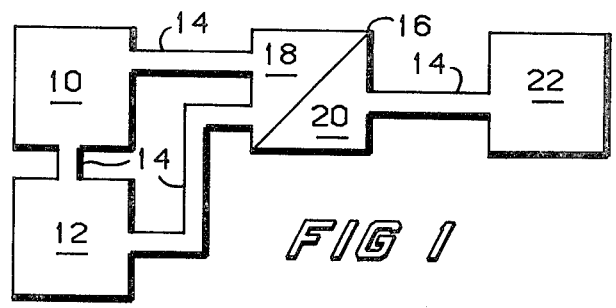
FIG. 1 shows a block diagram of the cooling system of this invention.

The basic functional relationships between the elements of the invention are shown schematically in FIG. 1. The two elements between which the cooling system operates are electronic components 10 and heat sink 22. This system is designed to use a heat sink which intermittently becomes too hot to maintain a safe temperature for the electronics. In the case of an air-launched missile, the missile skin may be an available heat sink during low-speed flight of the carry aircraft, but will be too hot while the aircraft "dashes" to a target and after the missile is launched. The uniqueness of this invention lies in the stategy of using the skin of the missile as a heat sink for as long as possible, then insulating the electronics from the skin and storing heat until the skin cools down. This provides a maximum amount of operational time for a minimum weight sacrifice.

To this end, as shown in FIG. 1, electronics 10 are in intimate thermal contact with a unidirectional heat conduction device 16 which has an input portion 18 and an output portion 20. Throughout FIG. 1, lines designated 14 are used to symbolize thermal contact. While in fact this thermal contact is generally achieved by face-to-face physical contact, lines 14 are useful to separate the distinct elements of the system for clarity. The basic function of device 16 is to provide a low resistance heat path from input 18 to output 20 and a very high resistance path in the opposite direction. Output portion 20 is in thermal contact (lines 14) with heat sink 22. Also in thermal contact with electronics 10 is heat storage medium 12, which is in thermal contact with input portion 18.

Unidirectional conduction device 16 may be any of a number of devices, such as two wedges of conductive material which are either separated or in contact. The preferred embodiment of the invention uses heat pipe/thermal diodes because of weight and throughput capacity advantages.

First, when the temperature of heat sink 22 is below the predetermined critical temperature, $T_c$, at which components 10 will begin to fail, heat pipe/thermal diode is in a heat pipe mode and heat generated by components 10 is conducted to sink 22 to be dissipated. Generally, the heat transfer capacity of heat pipe/thermal diode 16 will be chosen so that components 10 will remain below the temperature at which storage medium 12 most readily absorbs heat energy, thus storing very little heat during this mode of operation.

Second, when the temperature of sink 22 reaches a predetermined cut-off value, $T_1$, heat pipe/thermal diode 16 enters a diode mode and heat generated by components 10 is conducted to heat storage medium 12 to be stored. During this mode of operation, the temperature of sink 22 may rise substantially above the critical temperature $T_c$ without damaging components 10. This mode of operation may continue for a period of time determined by the mass of the heat storage medium 12 and its thermal properties. The choice of the particular medium in light of the weight limitations and the power requirements of each system will be obvious to one skilled in the art.

Third, when the temperature of sink 22 falls below the cut-off temperature $T_1$, heat pipe/thermal diode 16 re-enters a heat pipe mode and heat from both components 10 and storage medium 12 is conducted to sink 22 to be dissipated. After some period of time in this mode of operation substantially all of the stored heat in storage medium 12 will have been removed and the system will return to the first mode of operation. It is to be noted that no material is expended in any of the three modes and that the system requires no external assistance of any kind in recycling to its original state.

Figure 2A:
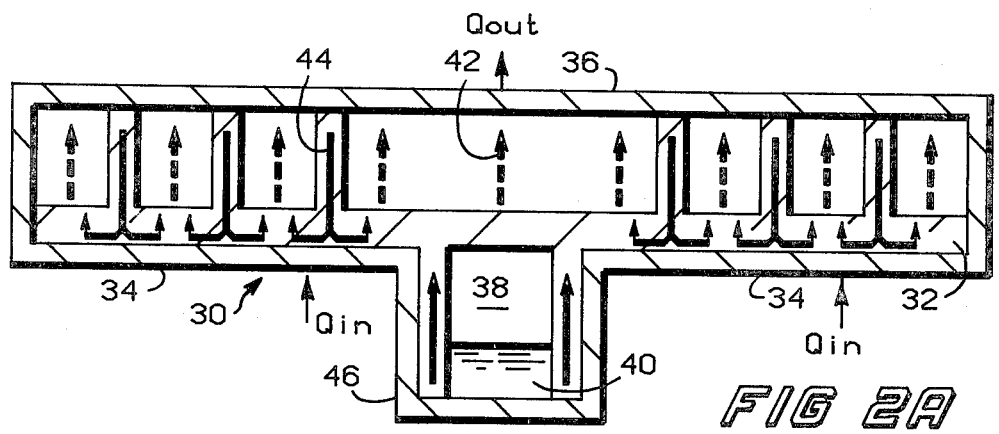
FIG. 2A shows a schematic of a heat pipe/thermal diode in the heat pipe mode.
Figure 2B:
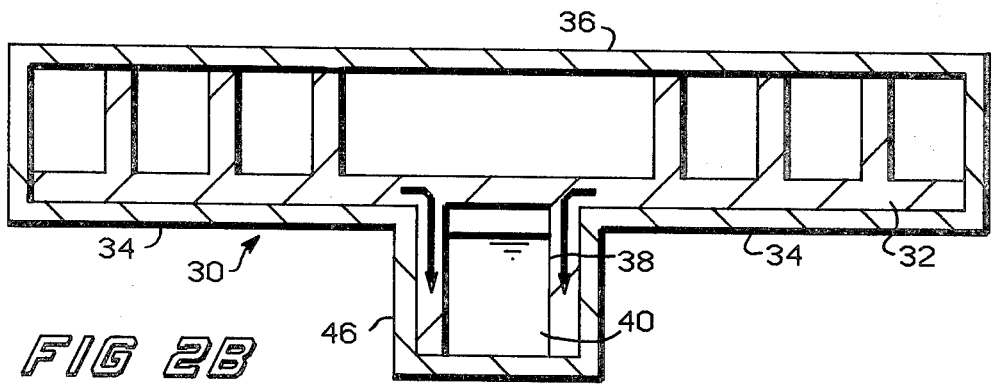
FIG. 2B shows a schematic of a heat pipe/thermal diode in the diode mode.

The operation of heat pipe/thermal diodes may best be understood by referral to FIGS. 2A and 2B. A typical device, such as may be purchased from the Hughes Aircraft Company, for example, is shown schematically in both FIGS. 2A and 2B, having a sealed container 30 comprising heat input portion 34 and heat output portion 36. Also shown as part of the container is reservoir 46, which is shown in this arrangement purely for schematic purposes. The particular arrangement will depend on the device purchased and choice of geometries will be obvious to one skilled in the art.

Referring now to FIG. 2A, the device is shown in the heat pipe mode. This mode occurs when the temperature of condenser 36 is below the cut-off temperature $T_1$. This temperature is a characteristic of the device and may be chosen to some degree to fit the critical temperature of the components. The choice of this temperature will be obvious to one skilled in the art. Covering the inside of evaporator 34 and extending at various places to condenser 36 is a wick 32 which moves working fluid 40 by capillary action. Motion of fluid 40 through wick 32 for this mode of operation is shown by arrows 44. Heat from the electronic components evaporates fluid 40 from wick 32. This tends to draw fluid from reservoir 38 until wick 32 is saturated. Vapor, shown by arrows 42, travels from evaporator 34 to condenser 36, where heat is released in the condensation process. This re-condensed fluid enters wick 32 at the condenser surface and is drawn back to evaporator 34 to be re-evaporated.

Referring now to FIG. 2B, the operation of a heat pipe/thermal diode is shown in the diode mode. When condenser 36 reaches a temperature $T_1$, a cut-off process begins. In general terms, the process occurs because reservoir 46 is maintained at or below $T_1$ by its placement inside the system. Thus, when the cut-off temperature is reached, any fluid in wick 32 tends to collect in reservoir 38. This liquid 40 is trapped and is not available for heat transfer. After some short period of time, determined by the design of the device, substantially all of the liquid 40 is trapped and heat can only be conducted in the reverse direction through the container 30 of the diode. The material and thickness of these walls may be chosen to suit particular limits on reverse mode heat conduction.

As described, the heat pipe/thermal diode is totally passive and recyclable, changing from one mode of operation to the other automatically.

The preferred embodiment of the invention maintains the temperature of reservoir 46 below the cutoff temperature by placing it in thermal contact with relatively large, stable thermal masses inside the system. It is also possible to artificially lower the temperature of the reservoir. For example, thermo-electric devices may be used in a circuit which senses the temperature of sink 22 and applies power to the thermo-electric devices when a predetermined sink temperature is reached. This will lower the reservoir temperature and hasten the process of collecting fluid 40 in reservoir 46. This modification will be applicable when very fast transition from heat pipe mode to diode mode is required and the power to operate the thermo-electric coolers is available.

As noted elsewhere, the choice of several design parameters is involved in the application of this invention to a particular system. The choice of these parameters is entirely obvious to one skilled in the art and it is the intention of Applicants that this invention not be limited to a particular set of values. However, for purposes of discussion of the preferred embodiment below, the design requirements of the particular missile system are discussed here. The system must be capable of dissipating 200 watts of thermal energy for relatively long periods (approximately 25 minutes) and at skin temperatures below the cutoff value. The cutoff temperature is chosen to be 50° C. for reasons of the critical temperatures of certain components. The system must be capable of storing approximately 1000 watts of thermal energy from the components and heat infiltrated from the skin for periods of about 5 minutes and at skin temperatures ranging up to 600° C. While these are not design values for all of the elements of the system, these values will allow any person skilled in the art to implement Applicants' preferred embodiment without undue experimentation.

Figure 3:
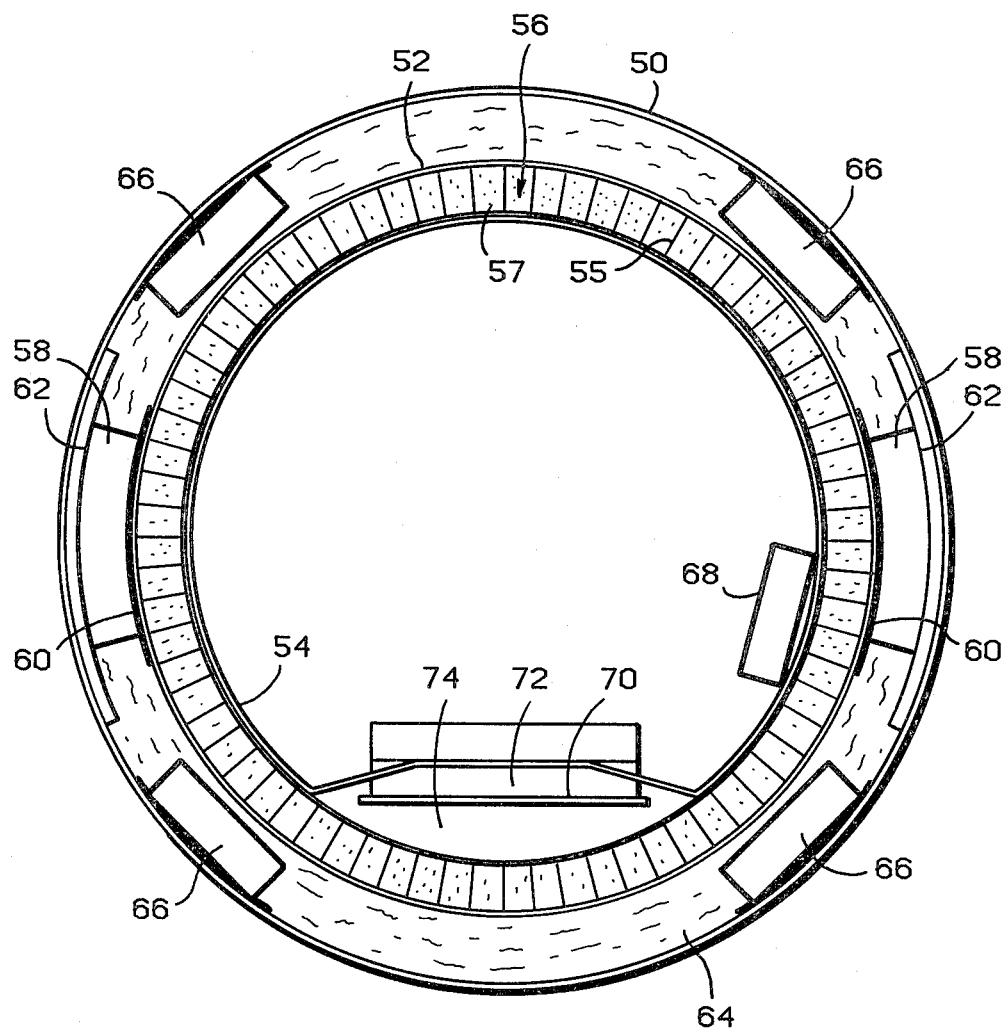
FIG. 3 shows a cross-section perpendicular to the longitudinal axis of a missile through the cooling system of this invention.

Referring now to FIG. 3, the preferred embodiment is shown in cross-section. The essential elements of the cooling system are contained in three concentric layers. The first layer is defined by the outer surface of the missile, skin 50, and by a first shell of conductive metal 52 which is preferably aluminum for its low density and high thermal conductivity. Occupying most of this first layer is insulation 64 which is designed to cut down infiltrated heat during high speed flight. Another portion of the first layer is occupied by missile components 66 unreleated to this invention. Finally, the remainder of the first layer is occupied by two heat pipe/thermal diodes 58, having condensers 62 in thermal contact with the skin and evaporators 60 in thermal contact with the first cylindrical shell 52. The reservoirs for these heat pipe/thermal diodes are not visible in this view. The reservoirs are placed toward the rear of the missile in this embodiment. In this way the forces acting on the working fluid when the missile is rapidly accelerating, as when it is launched, move the fluid very quickly to the reservoir, thus greatly decreasing the shut-down time of the device. It is possible to achieve shut-down times on the order of a few seconds as opposed to approximately one minute by using this technique.

The second layer is defined by first cylindrical shell 52 as an outer boundary and by second cylindrical shell 54 as an inner boundary. Second shell 54 is also preferably of aluminum for high heat conductivity. The second layer is entirely occupied by a metal honeycomb 55 filled with a material 57 having a high heat of fusion, the combination of which comprises heat storage medium 56. The honeycomb, as is well known in the art, comprises a large number of closed cells defined by heat conducting partitions 55 which extend from second shell 54 to first shell 52. While a commercially available honeycomb having cells generally hexagonal in shape is used in the preferred embodiment, the term honeycomb may refer to a large number of generally metal structures which will function as described below. Honeycomb is not intended to be limited to hexagonal-cell structures. The material in the cells is chosen for the large quantity of heat needed to change a unit mass of the material from solid to liquid. The material is chosen to undergo this phase transition at a temperature at or slightly above the cut-off temperature of diodes 58. Such examples of material 57 as the n-paraffins are well known in the art. The purpose of the honeycomb in this invention is twofold. First, melt fronts in the storage material which insulate remaining solid material from the heat source must be avoided. Second, a thermal connection is established between shell 52 and shell 54. The total cross-section of this thermal connection is relatively large due to the large number of honeycomb walls.

The third layer extends from the inner surface of shell 54 inward and is occupied by cable area 74, various connecting devices 70 and 72, and the electronic components 68 which are in thermal contact with shell 54.

During low skin temperature operation, a thermal pathway exists from components 68, through shell 54 and honeycomb 56, to shell 52 and thus to the evaporators 60 of heat pipes 58. In this condition heat pipes 58 are conducting and the heat is conducted to skin 50 and dissipated to the surrounding ambient air.

During high skin temperature operation, heat pipes 58 become non-conducting and heat is stored in storage medium 56. This design also has the advantage of storing external heat which infiltrates insulation 64 in storage medium 56 before such infiltrated heat reaches electronics 68.

When the skin temperature drops below 50° C. again, heat pipes 58 resume conducting heat from electronics 68 and also remove stored heat from storage medium 56 so that the system is recycled automatically.

Thus a system has been shown and particularly described which maintains the temperature of missile avionics 68 in a safe range for an indefinite period of low skin 50 temperature operation and which will maintain safe temperatures for a predetermined period of high skin temperature flight. Further, the system will allow intermittent periods of low and high temperature flight and will recycle automatically. The system is capable of being adapted to the size, weight, and power consumption requirements of a specific missile by anyone skilled in the art.

While the invention has been particularly shown and described with reference to a preferred embodiment thereof, it will be understood by those skilled in the art that various modifications and changes may be made to the present invention without departing from the spirit and scope thereof, as encompassed in the accompanying claims. Therefore it is intended in the appended claims to cover all such equivalent variations as come within the scope of the invention as described.

We claim:

1. In an air-launched missile having a skin portion, apparatus comprising:
    a first shell internal to said portion of skin and defining a first space therebetween, said first shell being heat conducting;
    a second shell internal to said first shell and defining a second space therebetween and a third space interior to said second shell, said second shell being heat conducting;
    unidirectional conduction means for conducting heat from at least one heat input portion to at least one heat output portion and for preventing heat conduction from said at least one heat output portion to said at least one heat input portion, said at least one heat input portion being in intimate thermal contact with said first shell and said at least one heat output portion being in intimate thermal contact with said skin portion;
    means for insulating said first shell from said skin portion, said insulating means occupying at least a portion of said first space not occupied by said unidirectional conduction means;
    means for distributing heat, said heat distributing means comprising a plurality of heat conducting partitions extending from said second shell to said first shell and defining in said second space a plurality of closed cells;
    means for storing heat, said heat storing means comprising a quantity of a material having a high heat of fusion, said heat storing means occupying at least a portion of said second space in said plurality of closed cells; and
    electronic components occupying said third space and being in intimate thermal contact with said second shell.

2. The apparatus according to claim 1 wherein said unidirectional conduction means comprises at least one heat pipe/thermal diode.

3. The apparatus according to claim 1 wherein said means for storing heat comprises a mass of an n-paraffin.

4. In an air-launched missile passive, recyclable cooling system for operation between a heat source and a heat sink comprising:
    heat conduction means in intimate thermal contact with said heat source for conducting heat away from said heat source, said heat conduction means defining a plurality of substantially closed cells;
    unidirectional conduction means in intimate thermal contact with said heat sink and said heat conduction means for conducting heat from said heat conduction means to said heat sink and for preventing the conduction of heat from said heat sink to said heat conduction means, said unidirectional conduction means being substantially independent of gravity; and heat storage means disposed in said plurality of closed cells for storing heat.

5. A cooling system according to claim 4 further comprising:

insulating means separating said heat conduction means and said heat source from said heat sink for preventing the conduction of heat from said heat sink to said heat source.

6. A cooling system according to claim 5 wherein said unidirectional conduction means comprises:

at least one heat pipe/thermal diode.

7. A cooling system according to claim 5 wherein said heat conduction means comprises:

a metal honeycomb.

8. A cooling system according to claim 5 wherein said heat storage means comprises:

a mass of material having a high heat of fusion.

* * * * *